(12) United States Patent
Beckert et al.

(10) Patent No.: US 10,790,108 B2
(45) Date of Patent: Sep. 29, 2020

(54) SURFACE MOUNTED PROTECTION DEVICE

(71) Applicant: Littelfuse, Inc., Chicago, IL (US)

(72) Inventors: James Beckert, Rolling Meadows, IL (US); Gregory Stumpo, Schaunburg, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/364,838

(22) Filed: Mar. 26, 2019

(65) Prior Publication Data

US 2019/0221396 A1 Jul. 18, 2019

Related U.S. Application Data

(62) Division of application No. 15/410,440, filed on Jan. 19, 2017, now Pat. No. 10,283,304.

(60) Provisional application No. 62/281,269, filed on Jan. 21, 2016.

(51) Int. Cl.
*H01H 85/20* (2006.01)
*H01H 85/04* (2006.01)
*H05K 1/18* (2006.01)
*H01H 69/02* (2006.01)

(52) U.S. Cl.
CPC ............ *H01H 85/04* (2013.01); *H01H 69/02* (2013.01); *H01H 85/20* (2013.01); *H01H 85/203* (2013.01); *H05K 1/181* (2013.01); *Y02P 70/611* (2015.11)

(58) Field of Classification Search
CPC ........ H01H 69/02; H01H 85/04; H01H 85/20; H01H 85/203; H01H 2085/0412; H01H 2085/0414; H01H 69/022; H05K 1/181; H05K 2201/10181; Y02P 70/611
See application file for complete search history.

(56) References Cited

U.S. PATENT DOCUMENTS

| 4,527,144 | A | * | 7/1985 | Arikawa | H01H 37/764 337/403 |
| 4,559,514 | A | * | 12/1985 | Arikawa | H01H 85/0411 337/201 |
| 5,648,750 | A | * | 7/1997 | Yuza | H01H 85/0411 337/252 |
| 5,727,313 | A | | 3/1998 | Paterek et al. | |

(Continued)

FOREIGN PATENT DOCUMENTS

WO 9819322 A1 5/1998

OTHER PUBLICATIONS

Extended European Search Report for the European Patent Application No. 17741962, dated Aug. 7, 2019, 6 pages.

*Primary Examiner* — Jacob R Crum

(57) ABSTRACT

Approaches herein provided surface mounted devices each configured as a stand-alone component suitable for attachment to a substrate such as a printed circuit board (PCB). In some embodiments, a method includes forming a base housing, coupling an electronic component to the base housing, and forming a cover over the electronic component, wherein the cover is coupled to the base housing. The electronic component may include a fusible link/element extending between terminals, the terminals wrapped around an exterior of base housing. The device may then be coupled to the PCB, for example, by attaching the terminals to an upper surface of the PCB.

7 Claims, 13 Drawing Sheets

(56) References Cited

U.S. PATENT DOCUMENTS

| | | | |
|---|---|---|---|
| 6,078,245 A * | 6/2000 | Fritz | H01H 85/046 |
| | | | 337/160 |
| 2002/0024784 A1 | 2/2002 | Pinto de Oliveira | |
| 2003/0024105 A1* | 2/2003 | Chiu | H01H 85/0411 |
| | | | 29/623 |
| 2006/0268645 A1 | 11/2006 | Graf et al. | |
| 2008/0191832 A1* | 8/2008 | Tsai | H01H 69/022 |
| | | | 337/297 |
| 2010/0245025 A1 | 9/2010 | de Leon et al. | |
| 2012/0133478 A1* | 5/2012 | Chiu | H01H 85/165 |
| | | | 337/228 |

* cited by examiner

SURFACE MOUNTED PROTECTION DEVICE

CROSS-REFERENCE TO RELATED APPLICATION

This application is a divisional of, and claims priority to, U.S. application Ser. No. 15/410,440, filed on Jan. 19, 2017, entitled "SURFACE MOUNTED PROTECTION DEVICE," which claims priority to U.S. Provisional Patent Application No. 62/281,269, filed Jan. 21, 2016, entitled "SURFACE MOUNTED DEVICE WITH INTEGRATED CARRIER TAPE," which applications are incorporated by reference herein in their entireties.

FIELD OF THE DISCLOSURE

The disclosure relates generally to the field of protection device components and, more specifically, to electronic components integrally formed within a housing structure mounted to a substrate surface.

BACKGROUND OF THE DISCLOSURE

As electronic devices have become smaller in size and higher in performance in recent years, more and more electronic parts are fabricated on chips. As such, there is a growing demand for packaging such on-chip electronic parts on a mass-production basis, for example, on an elongated tape using an automatic inserting machine.

A chip mounter, also known as a "chip shooter" or "placement machine," is one apparatus used for high-speed, high-precision mounting of electronic chips fed from a feeder to preset positions of a printed circuit board. In some instances, the chip mounter includes suction nozzles of a head are used to mount electronic chips. With the recent trend toward multifunctional, high-specification and down-sized electronic devices, the need is increasing to develop techniques for high-density mounting of electronic chips on printed circuit boards of the electronic devices.

Recently, technology for mounting chips on printed circuit boards is shifting from through-hole mounting to surface mounted technology (SMT). Surface mounted technology is used to directly mount chips in high density on the surface of printed circuit boards. Surface mounting devices (SMDs) for use in surface mounted technology may include tape roll or tray and stick types, depending on the feeding form of chips. Chip mounters may also be classified into tape feeders, tray feeders, and stick feeders by their chip feeding mode and/or according to the type of surface mounting devices. Of these, the most widely used are tape feeders that feed chips in the form of carrier tapes. An advantage of tape feeders is the ability to feed a large number of chips at high speeds.

A typical carrier tape consists of a base tape, storage spaces formed at regular pitches in the base tape, and a cover tape attached to an upper surface of the base tape. Small-sized electronic components, such as semiconductor chips, may be accommodated in the storage spaces of the base tape. The cover tape is then secured on the upper surface of the base tape to protect the electronic chips. Due to this construction, the carrier tape functions as a vehicle for feeding the electronic chips, into the chip mounter.

In one prior art approach, carrier tape may include a base tape made of paper and having transport holes formed at regular intervals at one lateral side thereof. The base tape may have storage spaces with a predetermined depth to accommodate devices therein. The cover tape may be made of a transparent polymer film adhesively attached to the base tape. While a tape feeder locks the transport holes of the base tape to move the carrier tape by specific pitches, the cover tape is separated from the base tape and the storage spaces are exposed so that the electronic chips can be picked-up by suction nozzles of a mounter. However, once the electronic chips are removed, the base tapes and cover tapes are separately discharged, thus requiring additional equipment and cost to accommodate the by-product.

SUMMARY

In view of the foregoing, provided herein are approaches for integrating an electronic component (e.g., a fusible element) within a housing of a surface mounted device to form a completed component suitable for attachment to a printed circuit board.

In one approach, a method of forming a device may include providing a base housing, and coupling an electronic component to the base housing, wherein the electronic component includes a set of terminals extending along an outer surface of the base housing. The method may further include forming a cover over the electronic component, wherein the cover is coupled to the base housing.

In another approach according to embodiments of the disclosure, a method for forming a surface mounted device includes providing a base housing, and coupling an electronic component to the base housing, wherein the electronic component including a fusible element extending between a set of terminals. The method may further include forming a cover over the fusible element, wherein the cover is coupled to the base housing, and wherein the set of terminals extend along an outer surface of the base housing. The method may further include coupling the electronic device to a printed circuit board.

Yet another approach includes a surface mounted device having a base housing, and an electronic component coupled to the base housing, wherein the electronic component includes a fusible element extending between a pair of terminals, and wherein the pair of terminals are coupleable to a substrate. The device may further include a cover disposed over the fusible element, wherein the cover is coupled to the base housing, and wherein the pair of terminals extend along an outer surface of the base housing.

Figure 1:
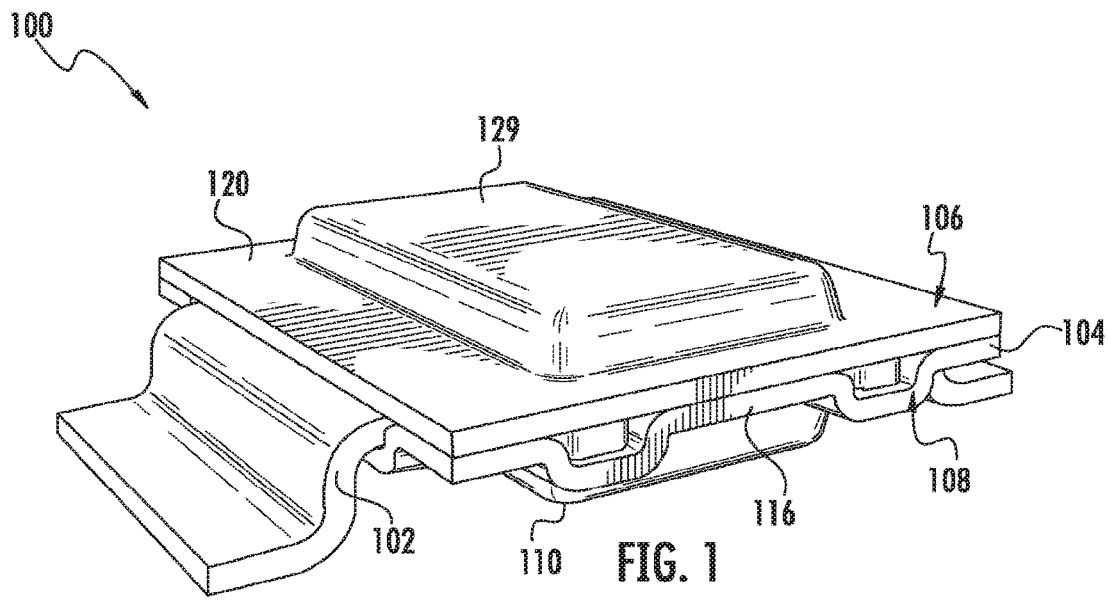
FIG. 1 is side perspective view of an electronic device in accordance with the present disclosure.
Figure 2:
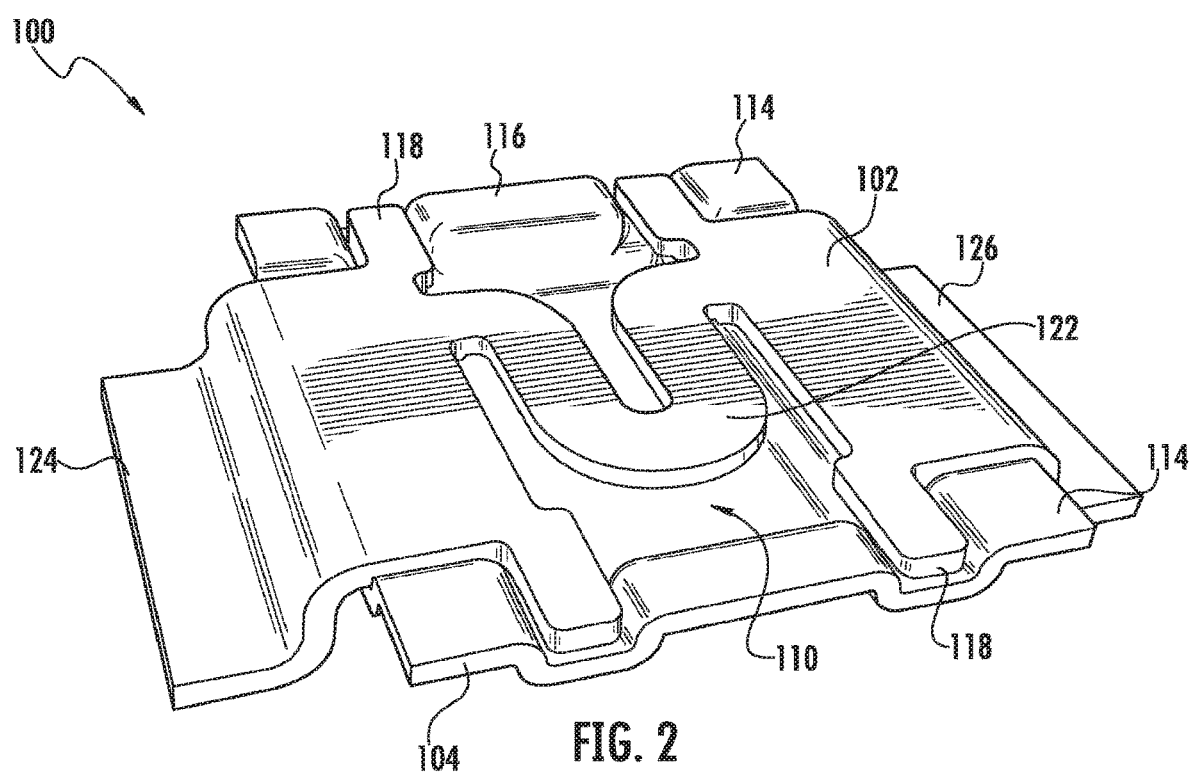
FIG. 2 is a side perspective view of the electronic device of FIG. 1 shown without a cover in accordance with the present disclosure.
Figure 3A:
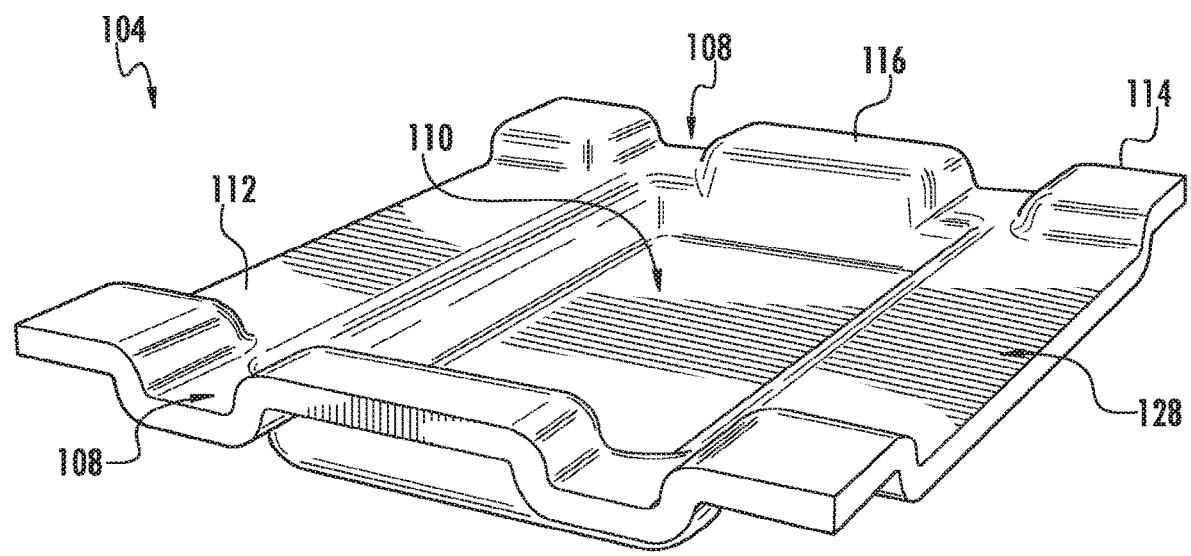
FIG. 3A is a side perspective view of a base housing of the electronic device of FIG. 1 in accordance with the present disclosure.
Figure 3B:
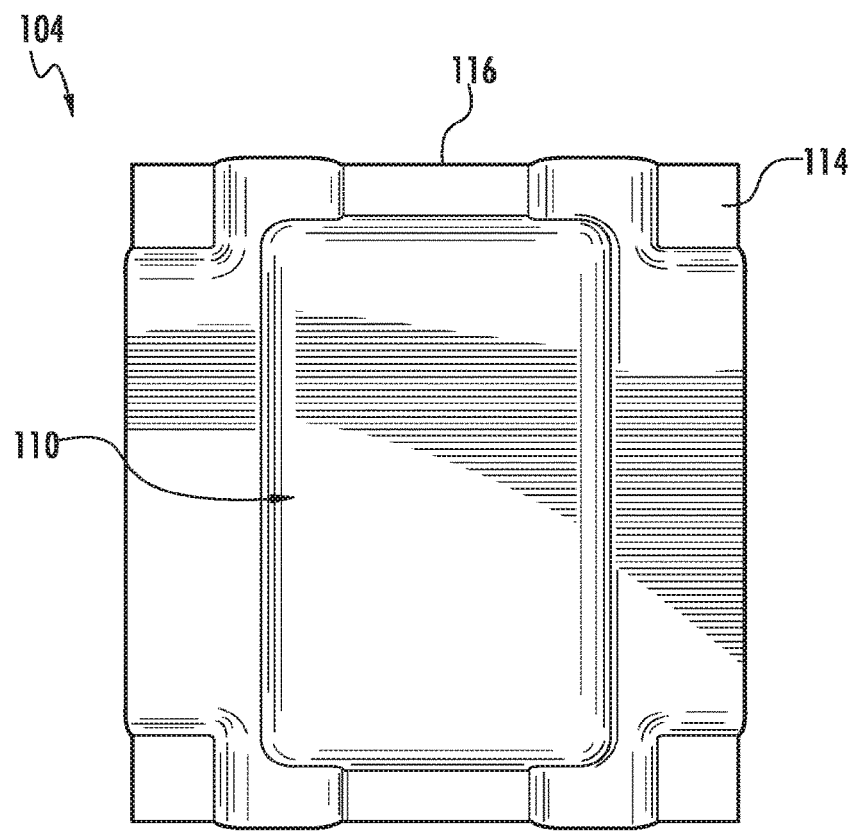
FIG. 3B is a bottom view of the base housing of the electronic device of FIG. 3A in accordance with the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

DETAILED DESCRIPTION

Various approaches in accordance with the present disclosure will now be described more fully hereinafter with reference to the accompanying drawings, where embodiments of a system and method are shown. The system(s) and method(s) may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

As stated above, provided herein are approaches for forming surface mounted devices as a completed or stand-alone component suitable for attachment to a substrate such as a printed circuit board (PCB). In some embodiments, a method includes forming a base housing, coupling an electronic component to the base housing, and forming a cover over the electronic component, wherein the cover is coupled to the base housing. The electronic component may include a fusible link/element extending between terminals, the terminals wrapped around an exterior of base housing. The device may then be coupled to the PCB, for example, by attaching the terminals to an upper surface of the PCB.

Referring now to FIGS. 1-4, an electronic device 100 (hereinafter "device") having a carrier tape integrated therein according to some embodiments will be described in greater detail. As shown, the device 100 includes an electronic component 102, such as an overcurrent protection device (e.g., a fuse), disposed between a base housing 104 and a cover 106, one or more of the base housing 104 and the cover 106 being formed from carrier tape, as will be described in greater detail below. In this embodiment, the base housing 104 includes a recessed center section 110 having a predetermined depth to accommodate the electronic component 102 therein. The recessed center section 110 may be surrounded by a deck 112 having a plurality of corner protrusions 114 and one or more end protrusions 116.

In some embodiments, the electronic component 102 is coupled to the base housing 104 by positioning one or more tabs 118 of the electronic component 102 within corresponding receiving channels 108 defined by the plurality of corner protrusions 114 and the end protrusions 116. As shown, the corner protrusions 114 are configured to abut a base section 120 of the cover 106, and may be coupled together by sonic welding, laser welding, adhesives, and the like.

The electronic component 102 may be a surface mounted device (SMD) such as a fuse. For example, the electronic component 102 may be a thin film, surface-mounted sub-miniature fuse used on a PC board or on a thick film hybrid circuit. As shown, the fuse may include a fusible element 122 (e.g., a link) connecting first and second terminals 124 and 126, and the tabs 118 are positioned between the fusible element 122 and the terminals 124, 126 for engaging the base housing 104 to elevate the fusible element 122 above or within the recessed center section 110. As will be understood, the fuse is provided as circuit protection for the electronic device 100, for example, in the case of an overcurrent condition. In one embodiment, the fusible element 122 includes a material with a melting point of less than approximately 420 degrees C., wherein the fusible element 122 acts as a thermal fuse by melting upon reaching a predetermined temperature. In another embodiment, the recessed center section 110 may be partially or completely filled with an arc suppressing material such as silica sand or ceramic powder to enhance the current and voltage interrupting properties of the electronic component 102.

Figure 4:
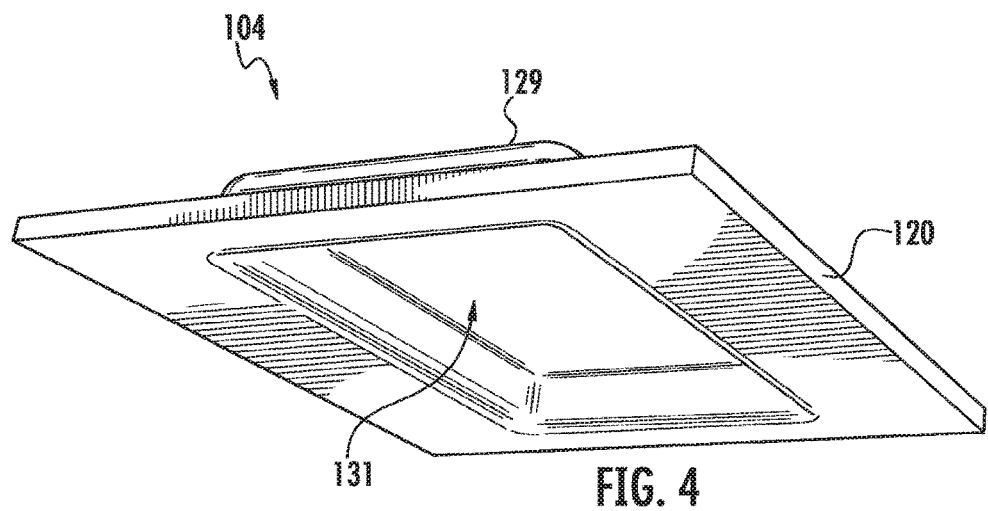
FIG. 4 is a side perspective view of a cover of the electronic device of FIG. 1 in accordance with the present disclosure.

As further shown, the terminals 124, 126 extend through a set of side channels 128 of the base housing 104 for connection with a printed circuit board, as will be described in greater detail below. In some embodiments, the set of side channels 128 are recessed below a top surface of the corner protrusions 114 to allow the terminals 124, 126 to pass therethrough when the base housing 104 and the cover 106 are adjoined. As shown in FIGS. 1 and 4, the cover 106 may include a raised center section 129 extending from the base section 120, away from the electronic component 102, so as to provide an internal cavity 131 for the fusible element 122.

Figure 5:
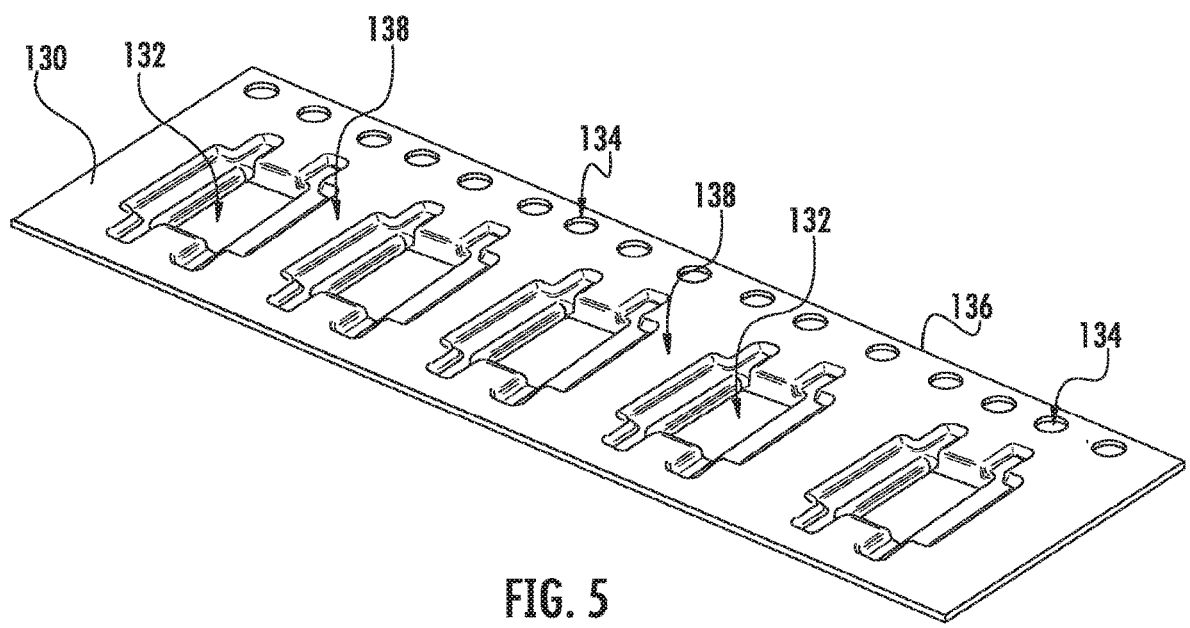
FIG. 5 is a side perspective view of a first section of carrier tape in accordance with the present disclosure.

Referring now to FIG. 5, a method for forming the device 100 having carrier tape integrated therein according to exemplary embodiments will be described in greater detail. Shown is a first section of carrier tape 130 (e.g., a bottom portion of carrier tape) having a plurality of recesses 132 and a plurality of advancement holes 134 formed therein. Each recess 132 may be sized to accept an electronic component, such as the electronic component 102 described above. The advancement holes 134 are arranged along a first edge 136 of the first section of carrier tape 130 at even intervals for engagement with feed pins (not shown) advanced by a motor. In some embodiments, the first section of carrier tape 130 is formed from a tape material such as a polymer (e.g., plastic) or resin-impregnated cardboard having a thickness of about 0.5 mm. Virtually any non-electrically conductive material could be used so long as it also the material has sufficient strength and heat resistance (e.g., it must withstand the reflow process after the pick-and-place in the placement machine).

Figure 6:
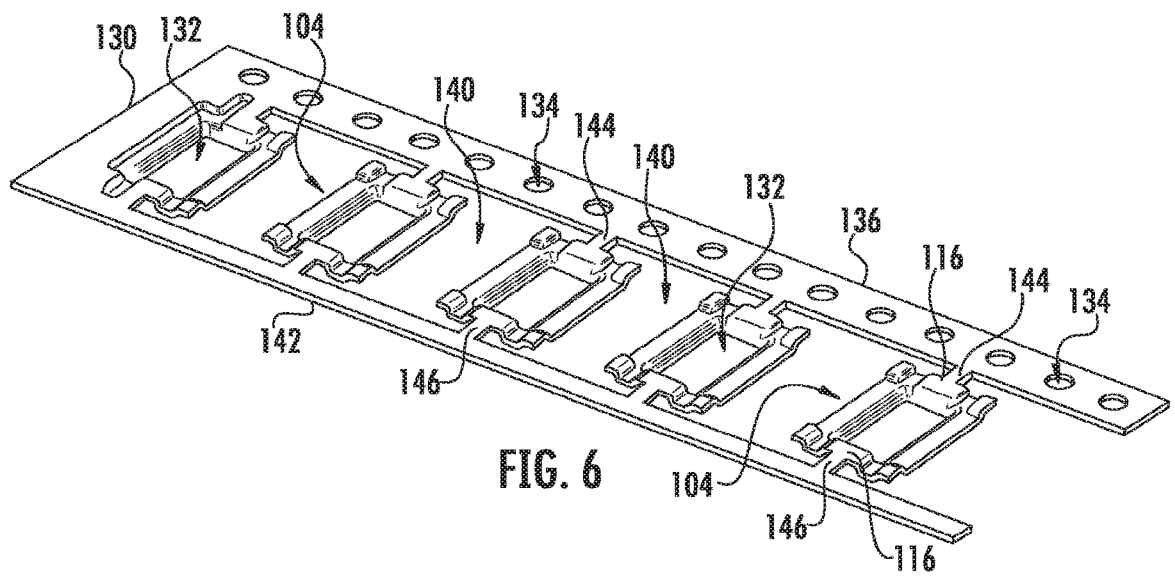
FIG. 6 is a side perspective view of the first section of carrier tape of FIG. 5 having a plurality of openings formed therein in accordance with the present disclosure.

Portions 138 of the first section of carrier tape 130 between each of the plurality of recesses 132 may then be removed (e.g., by stamping, by cutting, by EDM machining, or the like) to form a set of openings 140, for example as shown in FIG. 6. Once the portions 138 are removed, the first section of carrier tape 130 includes a plurality of base housings 104 coupled to the first edge 136 and to a second edge 142. Specifically, first and second connectors 144, 146 connect each end protrusion 116 to respective first and second edges 136, 142 of the first section of carrier tape 130.

Figure 7:
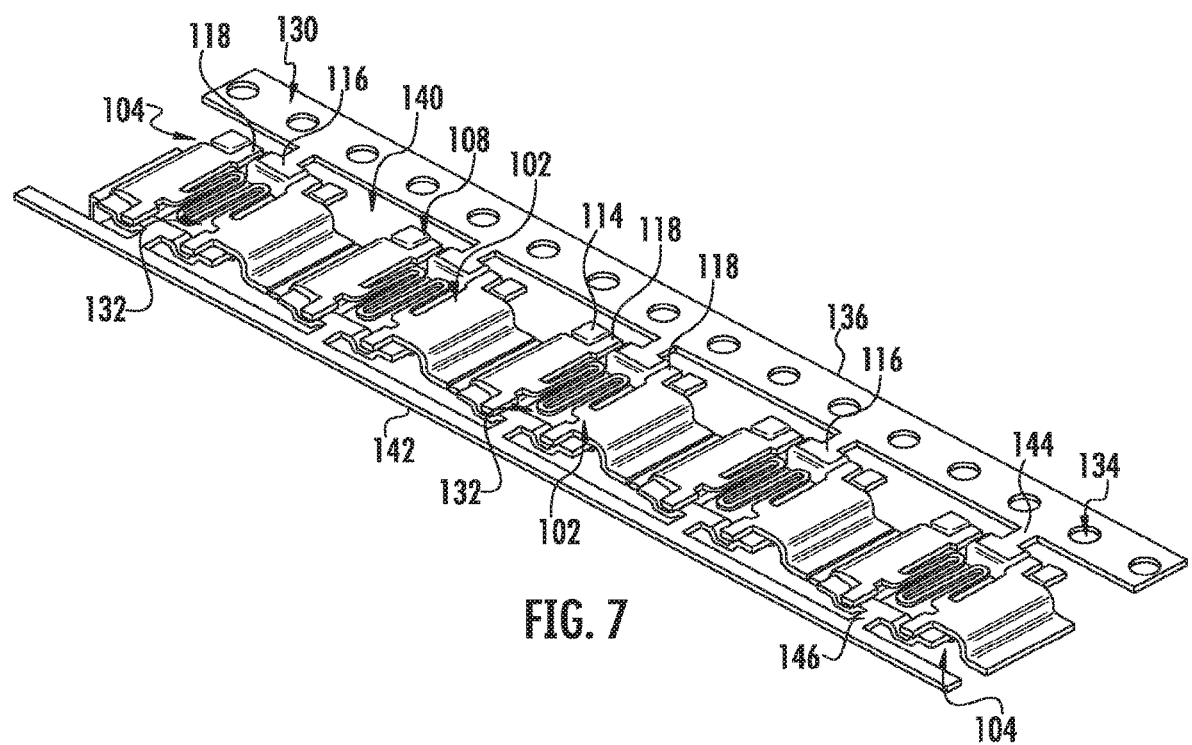
FIG. 7 is a side perspective view of a set of electronic components formed within the first section of carrier tape of FIG. 5 in accordance with the present disclosure.
Figure 8:
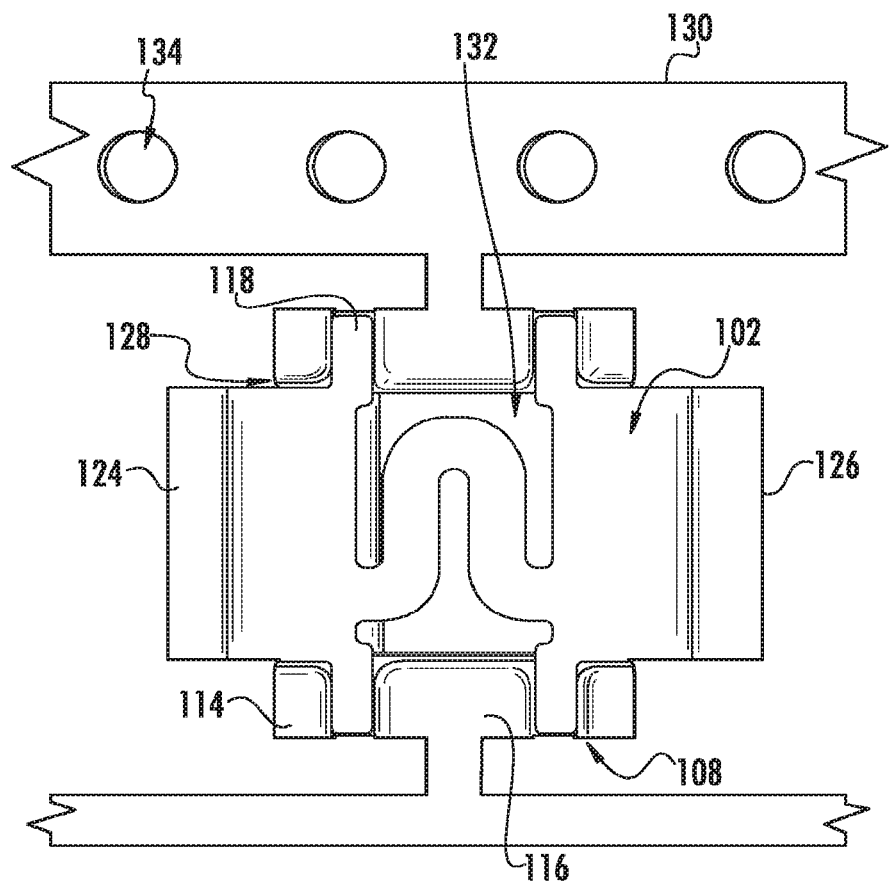
FIG. 8 is a top view of an electronic component formed within the first section of carrier tape of FIG. 5 in accordance with the present disclosure.
Figure 9:
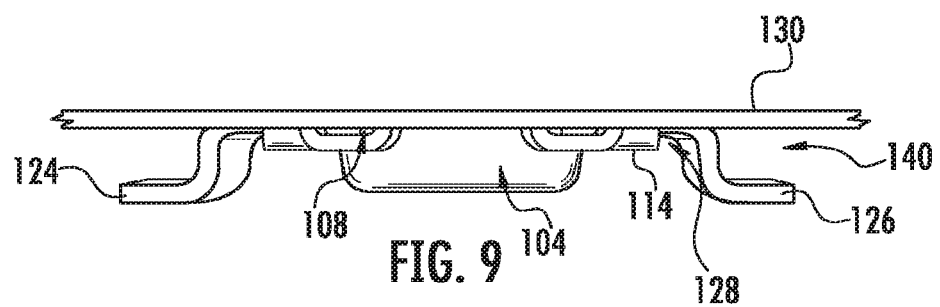
FIG. 9 is a side view of an electronic component formed within the first section of carrier tape of FIG. 5 in accordance with the present disclosure.

Turning now to FIGS. 7-9, insertion of one or more electronic components within the first section of carrier tape 130 according to exemplary embodiments will be described in greater detail. As shown, the electronic components 102 are inserted within the recesses 132 formed in the first section of carrier tape 130. In exemplary embodiments, the recesses 132 are generally dimensioned to receive the electronic component 102 therein. For example, the electronic component 102 may be coupled to the base housing 104 by positioning each of the tabs 118 of the electronic component 102 within corresponding receiving channels 108 defined by the plurality of corner protrusions 114 and the end protrusions 116. As shown, the first and second terminals 124, 126 of the electronic component 102 may extend laterally through the side channels 128 into the openings 140 below the first section of carrier tape 130, for example, as best shown in the side view of FIG. 9.

In some embodiments, each electronic component 102 is provided to the first section of carrier tape 130 via a vacuum carrier or the like. For example, each electronic component 102 may be picked up through vacuum suction with a suction nozzle (not shown) and, in this state, transferred to the first section of carrier tape 130 to a predetermined mounting position for insertion within each respective recess 132. However, embodiments herein are not thus limited, as various alternative techniques for providing the electronic components to the first section of carrier tape 130 are possible.

Figure 10:
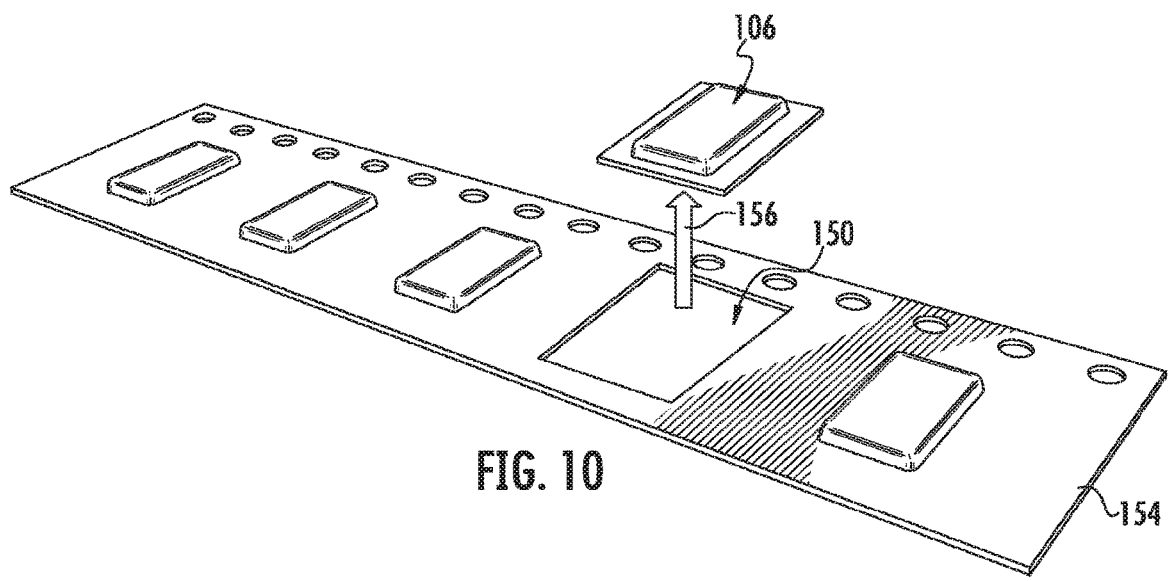
FIG. 10 is a side perspective view of a cover formed from a second section of carrier tape in accordance with the present disclosure.
Figure 11:
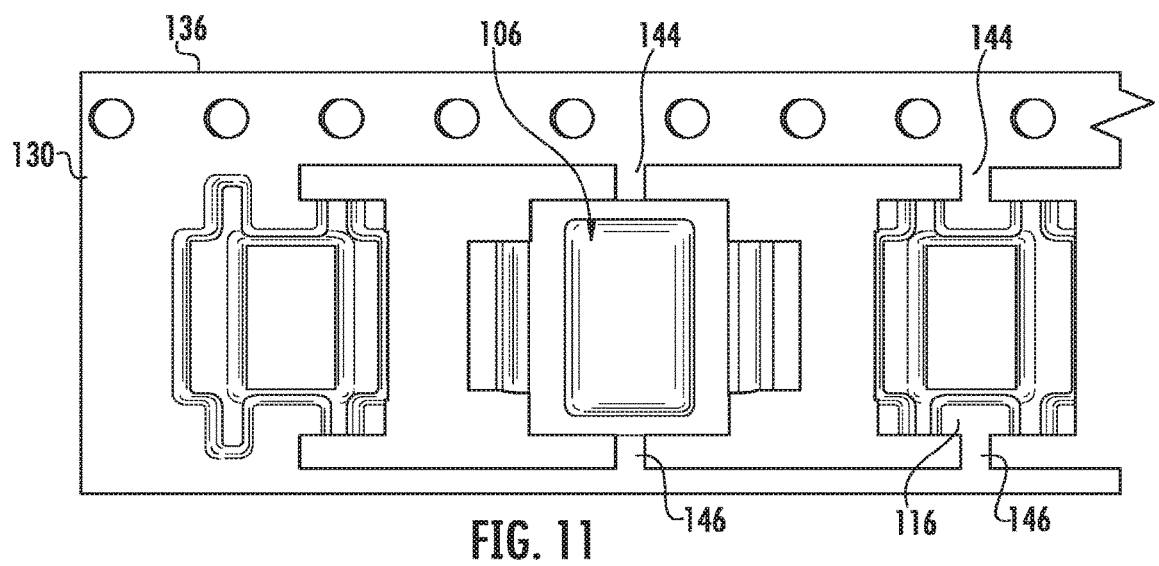
FIG. 11 is a top view of the cover and the second section of carrier tape in accordance with the present disclosure.

Turning now to FIGS. 10-11, an approach for forming the top cover 106 according to embodiments of the present disclosure will be described in greater detail. As shown, the top cover 106 may be produced by forming (e.g., cutting) an opening 150 in a second section of carrier tape 154 and extracting 156 the material therefrom. In one embodiment, the second section of carrier tape 154 is a complementary top layer of material (e.g., a transparent polymer film) secured to the first section of carrier tape 130 (e.g., by welding, molding, or an adhesive). Together, the second section of carrier tape 154 and the first section of carrier tape 130 may constitute an overall packaging tape, which is initially supplied to an automatic placement machine (not shown) via a carrier tape feeder for processing.

In one embodiment, a carrier tape feeder may receive the overall packaging tape and subsequently remove the first section of carrier tape 130 from the second section of carrier tape 154 using a separation a tool (e.g., a knife) within the placement machine. The second section of carrier tape 154 may be delivered to one processing area within the placement machine for formation of the opening 150 therein, while the first section of carrier tape 130 may be delivered to another processing area within the placement machine for receipt of one or more electronic components, as described above. In another embodiment, the first and second section of carrier tapes 130 and 154 may be initially processed by multiple, separate machines, wherein the extracted top cover 106 is subsequently delivered to the first section of carrier tape 130 for further processing. In yet another embodiment, the cover 106 is not formed from carrier tape. Instead, the cover 106 is separately formed (e.g., via injection molding or milling) into the desired shape suitable for engaging the first section of carrier tape 130 and covering one or more electronic components.

Once the cover 106 is formed, using any approach, it may be coupled to the first section of carrier tape 130, for example as shown in FIGS. 1 and 11. More specifically, the corner protrusions 114 of the base housing 104 connect to the base section 120 of the cover 106, for example, by sonic welding, laser welding, adhesives, and the like. In some embodiments, each cover 106 is provided to the first section of carrier tape 130 via a vacuum carrier or the like. For example, each cover 106 may be picked up through vacuum suction with a suction nozzle (not shown) and, in this state, transferred to the first section of carrier tape 130 to a predetermined mounting position. However, embodiments herein are not thus limited, as various alternative techniques for transferring and securing the cover 106 to the first section of carrier tape 130 are possible.

Figure 12:
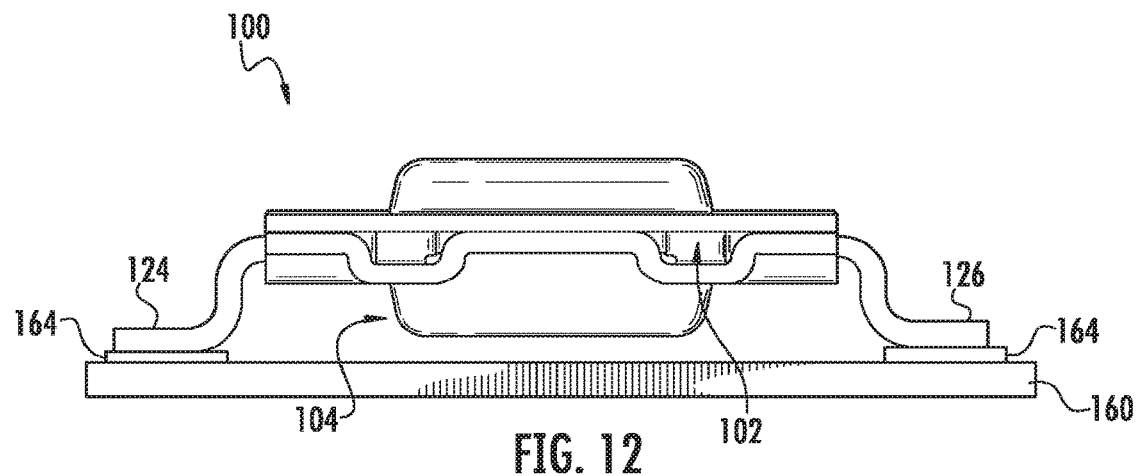
FIG. 12 is a side view of the electronic device coupled to a substrate in accordance with the present disclosure.

Referring now to FIGS. 11-12, an approach for securing the electronic device 100 to a substrate or printed circuit board (PCB) according to exemplary embodiments will be described in greater detail. During processing, after the cover 106 is secured to the first section of carrier tape 130, as described above, each of the first and second connectors 144, 146 may be cut or broken to disconnect each end protrusion 116 from respective first and second edges 136, 142 of the first section of carrier tape 130. The electronic device 100 may then be extracted from the first section of carrier tape 130, e.g., via a vacuum carrier or the like, and secured to a PCB 160, for example as shown in FIG. 12. More specifically, the first terminal 124 and the second terminal 126 are coupled to the PCB 160 via a conductive connective material 164 (e.g., copper, copper alloy, silver, or the like) configured to provide electrical connection between the terminals 124, 126 and a circuit of the PCB 160. In other embodiments, the terminals 124, 126 may extend through openings (not shown) in the PCB 160.

Although not limited to such, the PCB 160 may be a FR4-type PCB, wherein "FR" stands for flame retardant, and denotes that safety of flammability of FR-4 is in compliance with the standard UL94V-0. FR-4 is a composite material composed of woven fiberglass cloth with an epoxy resin binder that is flame resistant (e.g., self-extinguishing). FR-4 may be created from the constituent materials epoxy resin, woven glass fabric reinforcement, brominated flame retardant, etc.

As shown in FIG. 12, the electronic device 100 coupled to the PCB 160 includes the first section of carrier tape 130 contained therein. Unlike other approaches in which electronic components are separated from the carrier tape before insertion to a printed circuit board, embodiments of the present disclosure include the first section of carrier tape 130 as a part of the electronic device 100, in the form of the base housing 104, as well as the second section of carrier tape 154, in the form of the cover 106, thus reducing cost and simplifying assembly of the electronic component 102 with the PCB 160.

Referring now to FIGS. 13-17, another method for forming a device having carrier tape integrated therein according to exemplary embodiments will be described in greater detail. Shown is a carrier tape 200 having a first section 230 (e.g., a bottom portion of the carrier tape 200) and a second section 231 (e.g., a top portion of the carrier tape 200), the first section 230 having a plurality of recesses 232 formed therein, each recess 232 sized to accept an electronic component, such as the electronic component 102 described above. The carrier tape 200 includes a plurality of advancement holes 234 arranged along respective edges 236 and 237 for engagement with feed pins (not shown), e.g., advanced by a motor. In exemplary embodiments, the carrier tape 200 is a polymer (e.g., plastic).

Figure 13:
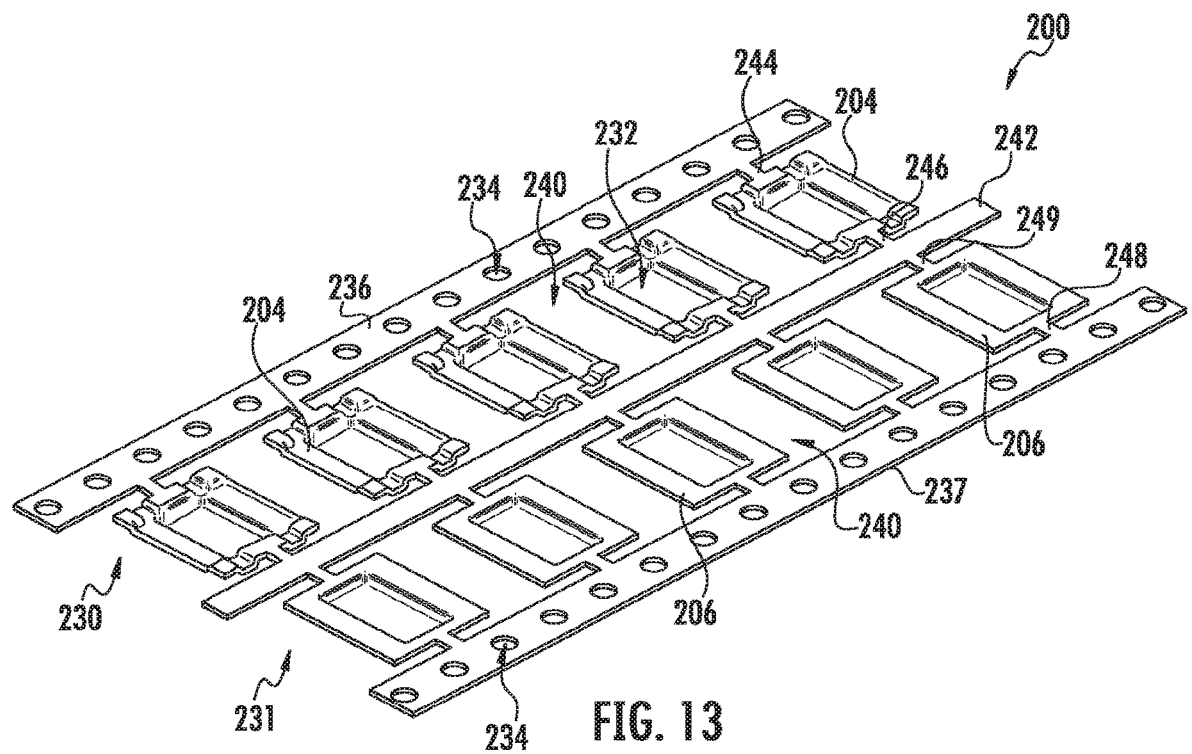
FIG. 13 is a side perspective view of a carrier tape in accordance with the present disclosure.

In the configuration depicted in FIG. 13, portions of the first and second sections 230, 231 of the carrier tape 200 have been removed (e.g., by stamping, by cutting, by EDM machining, or the like) to form a plurality of base housings 204 and a plurality of covers 206. As shown, each base housing 204 is coupled to the first edge 236 and to a central connector 242, while each of the plurality of covers is coupled to the second edge 237 and the central connector 242. More specifically, for the first section 230, first and second connectors 244, 246 connect each end protrusion 216 to the first edge 236 and to the central connector 242, respectively. Meanwhile, for the second section 231, first and second connectors 248, 249 connect each cover 206 to the second edge 237 and to the central connector 242, respectively.

Figure 14:
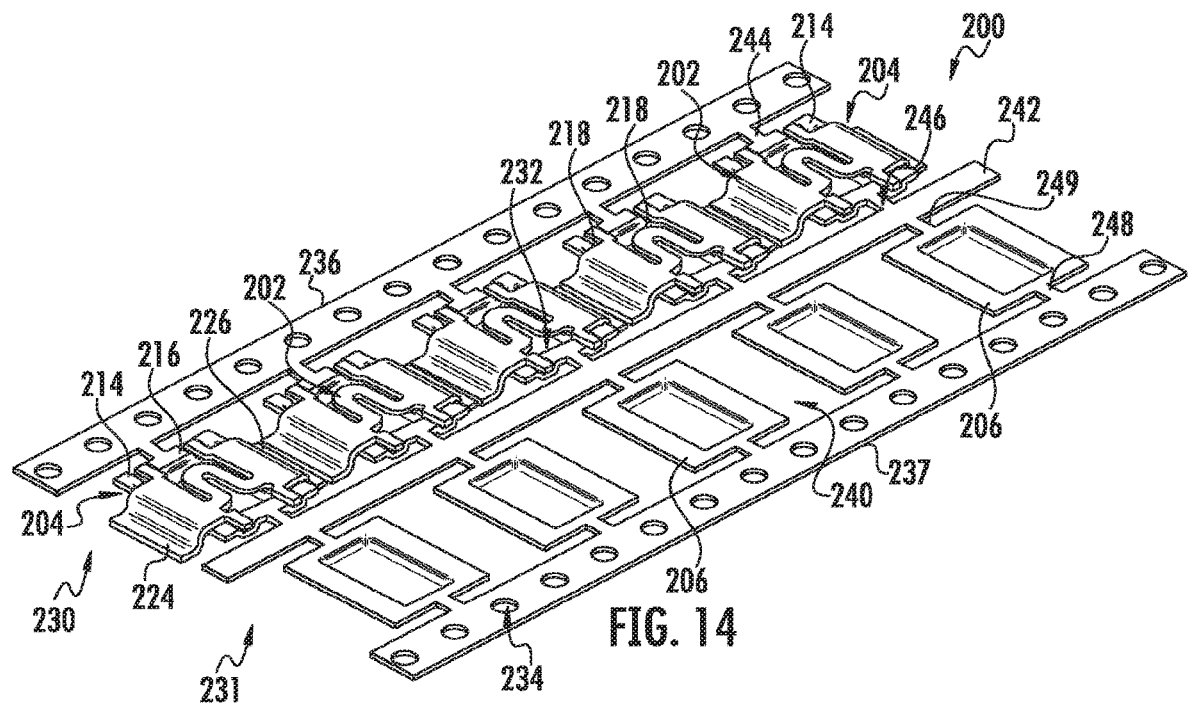
FIG. 14 is a side perspective view of a set of electronic components formed within a first section of the carrier tape of FIG. 13 in accordance with the present disclosure.

As shown in FIG. 14, one or more electronic components 202 may then be inserted within the carrier tape 200. Specifically, the electronic components 202 are inserted within the recesses 232 formed in the first section 230 of the carrier tape 200. In exemplary embodiments, as discussed above, the recesses 232 are generally dimensioned to receive the electronic component 202 therein. For example, the electronic component 202 may be coupled to the base housings 204 by positioning each of the tabs 218 within corresponding receiving channels defined by the plurality of corner protrusions 214 and the end protrusions 216. The first and second terminals 224, 226 of the electronic component 202 extend laterally and downward into the openings 240 of the first section 230 of the carrier tape 200, as shown.

In some embodiments, each electronic component 202 is provided to the carrier tape 200 via a vacuum carrier or the like. For example, each electronic component 202 may be picked up through vacuum suction with a suction nozzle (not shown) and, in this state, transferred to the carrier tape 200 to a predetermined mounting position for insertion within each respective recess 232. However, embodiments herein are not thus limited, as various alternative techniques for providing the electronic components to the carrier tape 200 are possible.

Figure 15:
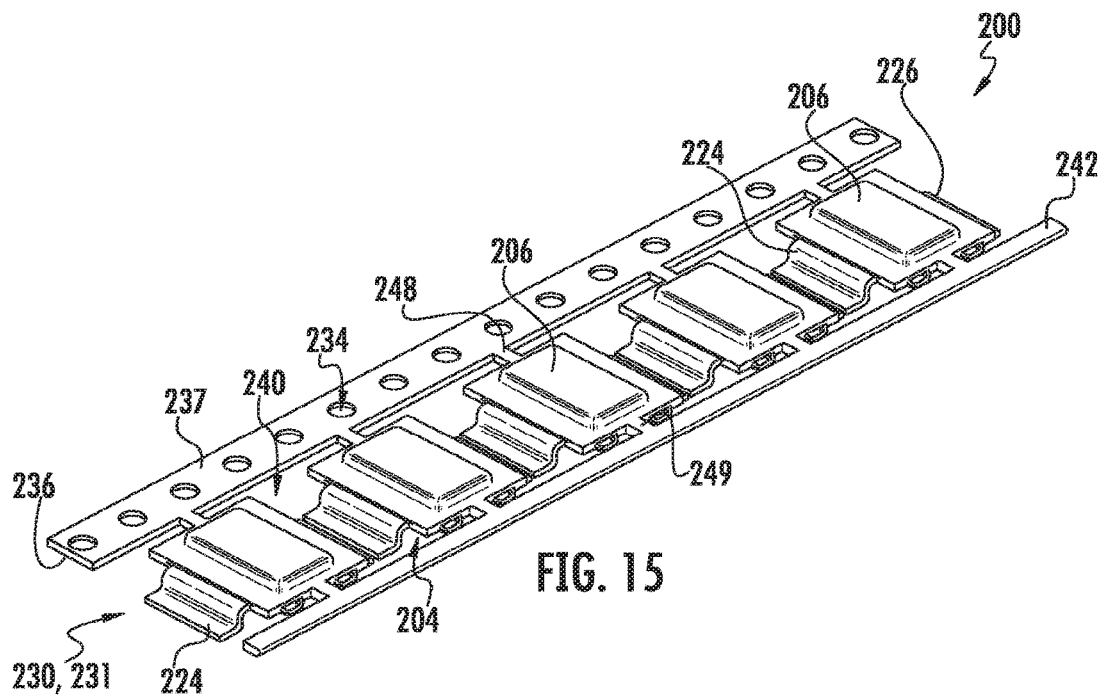
FIG. 15 is a side perspective view of the carrier tape of FIG. 13 in accordance with another embodiment of the present disclosure.
Figure 16:
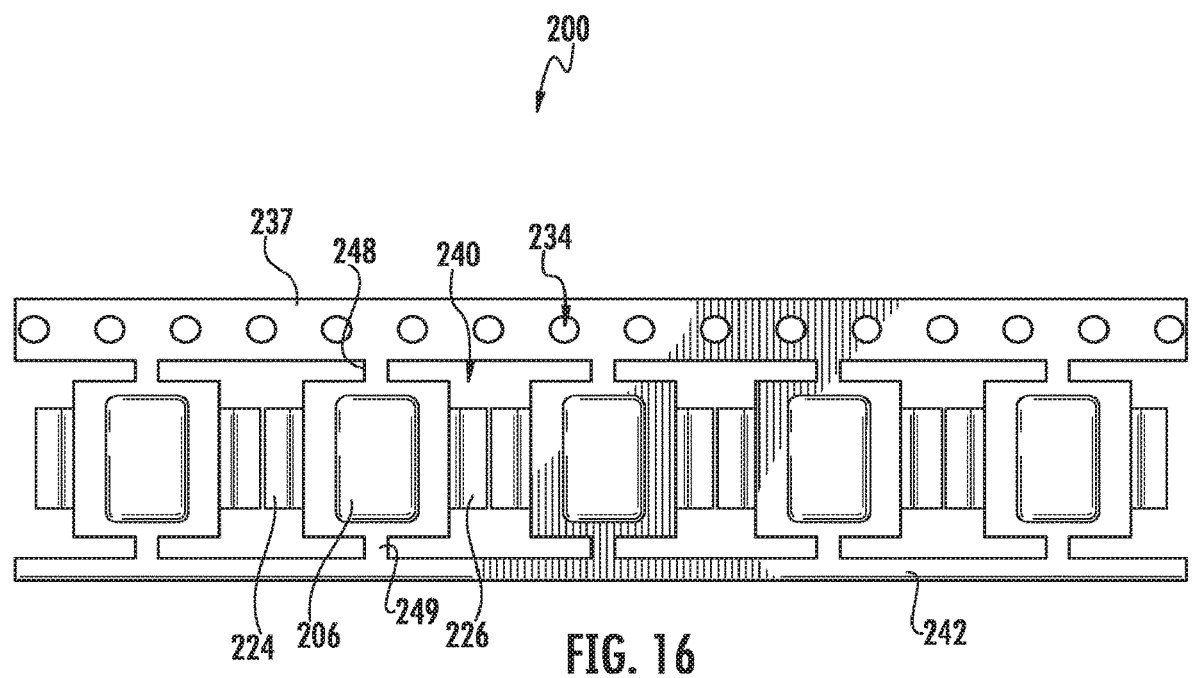
FIG. 16 is a top view of the carrier tape of FIG. 15 in accordance with the present disclosure.
Figure 17:
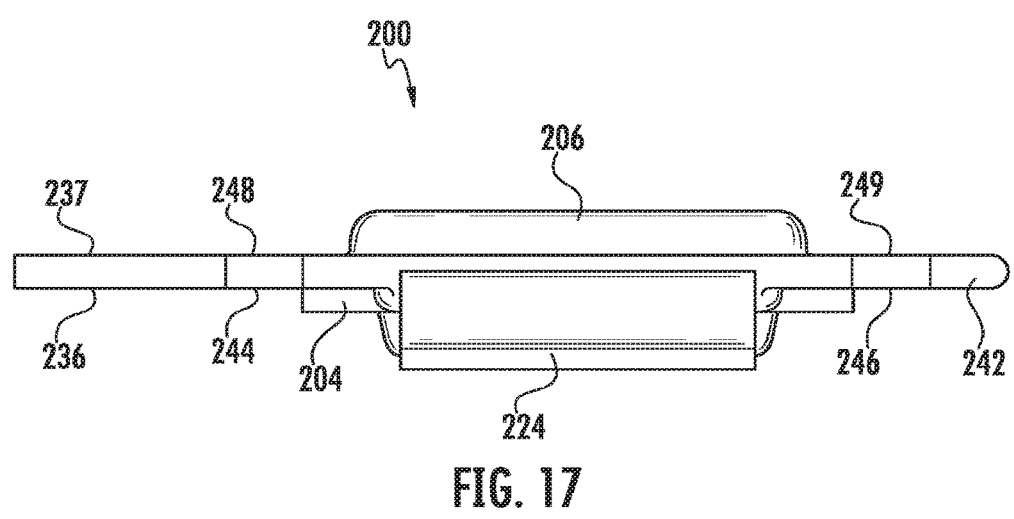
FIG. 17 is a side view of the carrier tape of FIG. 15 in accordance with the present disclosure.

Turning now to FIGS. 15-17, an approach for attaching the plurality of covers 206 to the plurality of base housings 204 according to embodiments of the present disclosure will be described in greater detail. As shown, the second section 231 of the carrier tape 200 is brought from its position adjacent the first section 230, for example as shown in FIG. 14, and positioned atop the first section 230. In other words, the second section 231 (or alternatively the first section 230) may be pivoted or folded about the central connector 242 such that the plurality of covers 206 and the plurality of base housings 204 are aligned. Each corresponding base housing 204 and cover 206 may then be secured together. More specifically, the corner protrusions 214 of the base housing 204 connect to the base section 220 of the cover 206, for example, by sonic welding, laser welding, adhesives, and the like. In exemplary embodiments, the second edge 237 is also similarly coupled to the first edge 236, so that the advancement holes 234 arranged along respective edges 236 and 237 align. Once configured, the carrier tape 200 shown in FIGS. 15-17 may constitute an overall packaging tape, which may be supplied to an automatic placement machine (not shown) via a carrier tape feeder for processing.

During processing, after the first and second sections 230 and 231 of the carrier tape 200 are joined, each of the connectors securing the base housing 204 and the cover 206 may be cut or broken. The electronic device (such as the electronic device 100 depicted in FIG. 1) may then be extracted from the carrier tape 200, e.g., via a vacuum carrier or the like, and secured to a PCB, for example as shown in FIG. 12.

Figure 18:
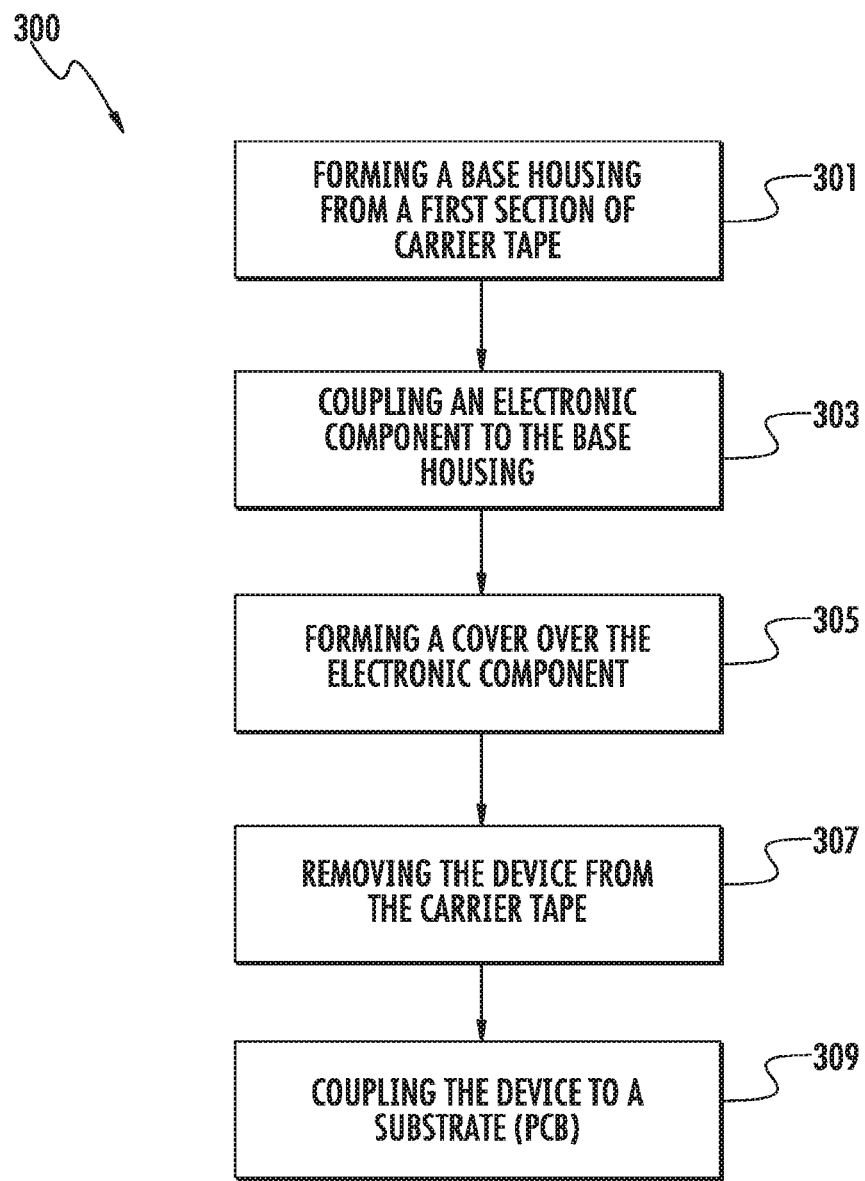
FIG. 18 is a flow chart of an approach for forming electronic devices in accordance with the present disclosure.

FIG. 18 is a flow diagram of a method 300 according to embodiments of the disclosure. The method 300 may include forming a base housing from a first section of carrier tape, as shown by block 301. In some embodiments, the base housing is formed by removing portions of the first section of carrier tape between each of a plurality of recesses formed in the first section of carrier tape. In some embodiments, the base housing is coupled to the carrier tape using a set of connectors, wherein the device may be subsequently removed from the first section of carrier tape by decoupling the set of connectors. In some embodiments, the carrier tape includes a second section of the carrier tape adjacent the first section of carrier tape. In some embodiments, the first and second sections of the carrier tape initially lie in a same plane.

The method 300 may further include coupling an electronic component to the base housing, as shown by block 303. In some embodiments, the electronic component is inserted within a recess formed in the first section of carrier tape. In some embodiments, the electronic component is a fuse. In some embodiments, the fuse may include a fusible element connecting first and second terminals, and tabs positioned between the fusible element and the terminals for engaging the base housing to elevate the fusible element above/within a recessed center section of the base housing.

The method 300 may further include forming a cover over the electronic component, as shown in block 305, wherein the cover is coupled to the base housing. In some embodiments, the cover is formed from a second section of carrier tape. In some embodiments, the cover is coupled to the base housing after the portions of the carrier tape are removed from between each of the plurality of recesses formed in the first section of carrier tape, and after the openings are formed in the second section of carrier tape. In some embodiments, a first edge of the carrier tape, adjacent the base housing, is coupled to a second edge of the carrier tape, adjacent the cover. In some embodiments, the carrier tape is folded or bent about a central connector coupling the first section and the second section of the carrier tape.

The method 300 may further include removing the device by extracting, from the first section of carrier tape, each of: the electronic component, the base housing, and the cover, as shown in block 307. In some embodiments, the device may be removed from the first section of carrier tape by decoupling the set of connectors.

The method 300 may further include coupling the device to a substrate, such as a printed circuit board, as shown in block 309. In some embodiments, a set of terminals is coupled to the PCB. In some embodiments, a connective material electrically connects the set of terminals to the printed circuit board.

Figure 19A:
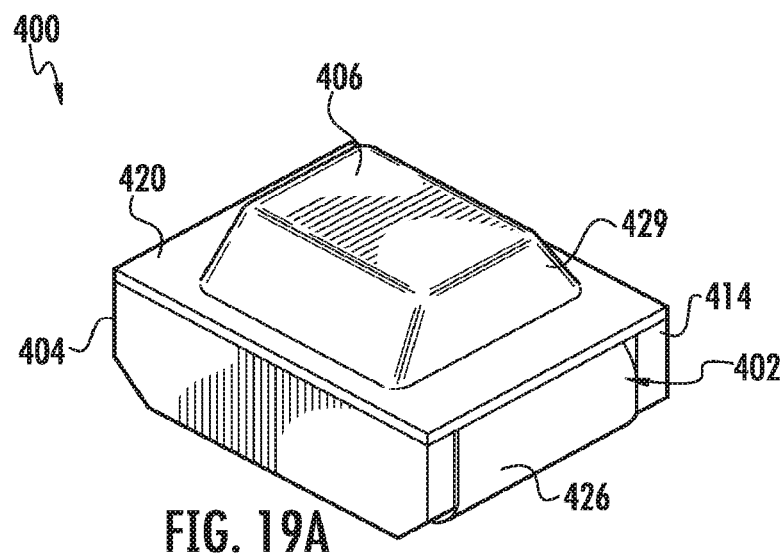
FIG. 19A is a perspective view of a device in accordance with the present disclosure.
Figure 19B:
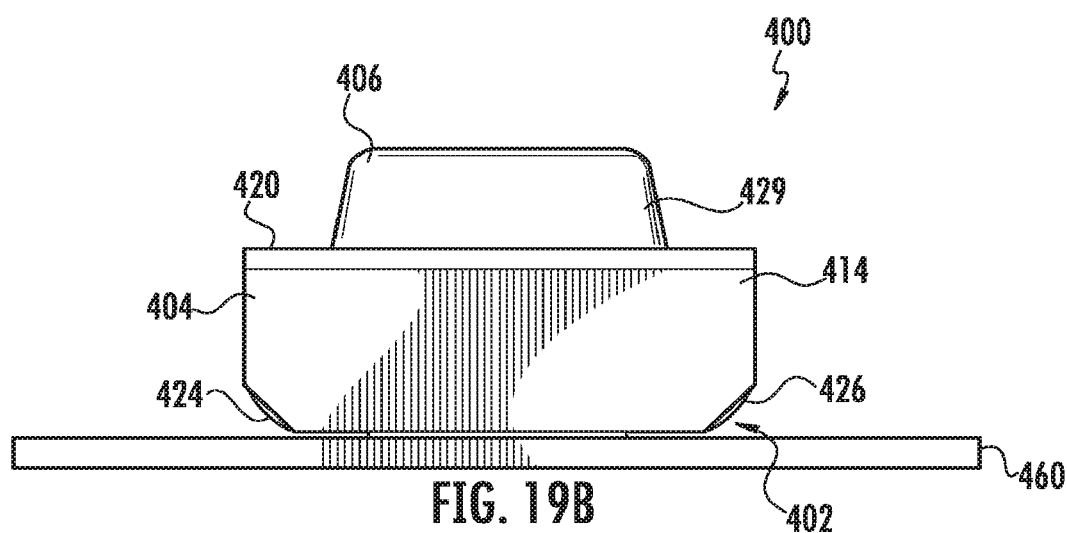
FIG. 19B is a side view of the device of FIG. 19A in accordance with the present disclosure.
Figure 19C:
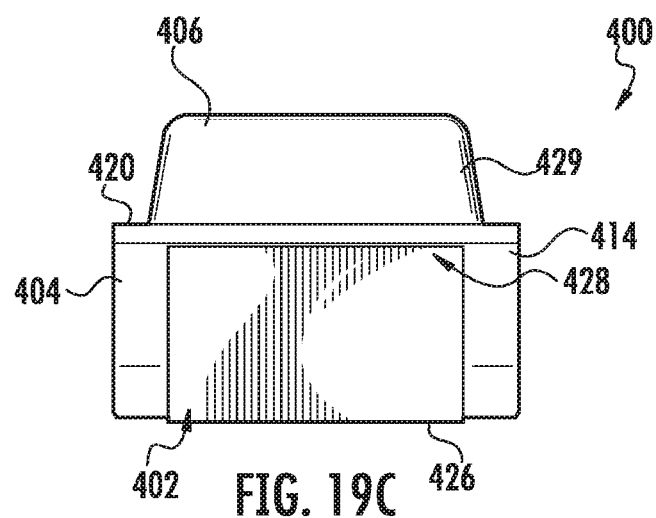
FIG. 19C is an end view of the device of FIG. 19A in accordance with the present disclosure.

Referring now to FIGS. 19A-C, an electronic device 400 (hereinafter "device") according to exemplary embodiments of the disclosure will be described in greater detail. As shown, the device 400 includes an electronic component 402 (e.g., a fuse) disposed between a base housing 404 and a cover 406, wherein one or more of the base housing 404 and the cover 406 may be formed from carrier tape. The electronic component 402 may be a surface mounted protection device, for example, a thin film, surface-mounted subminiature fuse used on a PC board or on a thick film hybrid circuit. More specifically, the electronic component 402 may include a fusible element or link (not shown) connecting first and second terminals 424 and 426, which wrap around the base housing 404.

As will be understood, the fuse is provided as circuit protection for the electronic device 400, for example, in the case of an overcurrent condition. In one embodiment, the fusible element may include a material with a melting point of less than approximately 420 degrees C., wherein the fusible element acts as a thermal fuse by melting upon reaching a predetermined temperature. In another embodiment, the base housing 404 may be partially or completely filled with an arc suppressing material such as silica sand or ceramic powder to enhance the current and voltage interrupting properties of the electronic component 402.

As further shown, the terminals 424, 426 extend through a set of terminal channels 428 of the base housing 404 for connection with a PCB 460 (FIG. 19B). In some embodiments, the set of terminal channels 428 extend through an outer surface of the base housing 404 and are recessed below a top surface of a corner protrusion 414 of the base housing 404 to allow the terminals 424, 426 to pass therethrough when the base housing 404 and the cover 406 are adjoined. Furthermore, in some embodiments, the cover 406 may include a raised center section 429 extending from a base section 420, away from the electronic component 402, so as to provide an internal cavity for the fusible element.

Figure 20A:
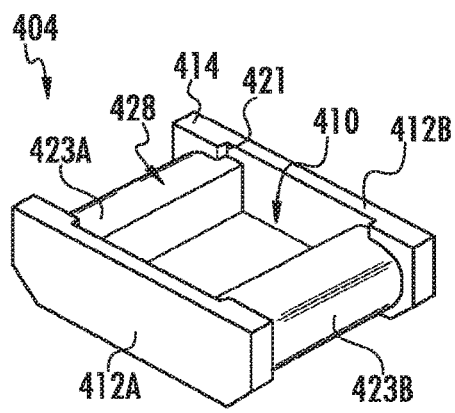
FIGS. 20A-D depict a process flow for forming the device of FIGS. 19A-C in accordance with the present disclosure.

Referring now to FIGS. 20A-E, a method for forming the device 400 according to exemplary embodiments of the disclosure will be described in greater detail. Shown in FIG. 20A is the base housing 404, which in some embodiments may be formed from a first section of carrier tape. In some embodiments, the base housing 404 includes a recessed center section 410 having a predetermined depth to accommodate the electronic component 402 therein. The recessed center section 410 may be surrounded by a pair of sidewalls 412A-B, each having a set of corner protrusions 414. A pair of opposing end walls 423A-B are coupled or integrally formed with the pair of sidewalls 412A-B and define the set of terminal channels 428 configured to receive the terminals 424, 426.

Figure 20B:
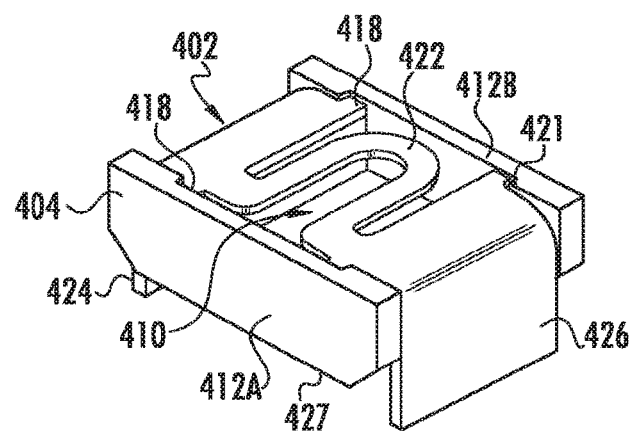
Figure 20C:
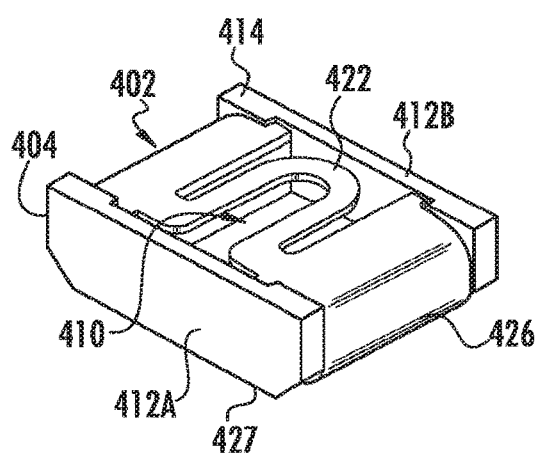

As shown in FIG. 20B, the electronic component 402 is formed over the base housing 404 such that the fusible element 422 is provided over the recessed center section 410, and the first and second terminals 424, 426 are formed atop the pair of opposing end walls 423A-B. The electronic component 402 may be aligned within the recessed center section 410 of the base housing 404 by positioning one or more tabs 418 against corresponding interior abutments 421. In some embodiments, the first and second terminals 424, 426 may be recessed below a top surface of the pair of sidewalls 412A-B to allow the terminals 424, 426 to pass therethrough when the cover 406 is secured to the base housing 404. The first and second terminals 424, 426 may then be formed about a bottom surface 427 of the base housing 404, for example as shown in FIG. 20C. That is, the terminals 424, 426 wrap around an exterior surface of the pair of opposing end walls 423A-B of the base housing 404. In some embodiments, the first and second terminals 424, 426 are formed at least partially along the bottom surface 427 of the base housing 404 for connection with the PCB 460 (FIG. 19B). In some embodiments, a connective material, such as the conductive connective material 164 shown in FIG. 12, may electrically connect the first and second terminals 424, 426 to the printed circuit board.

Figure 20D:
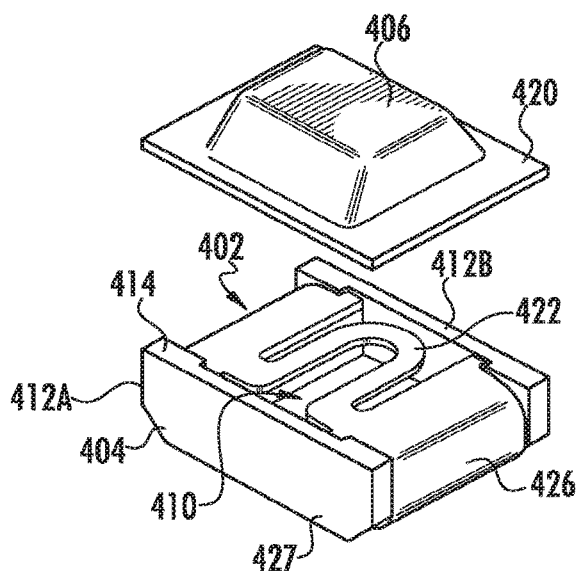

As shown in FIG. 20D, the cover 406 may then be formed atop the base housing 404. In some embodiments, the corner protrusions 414 of the base housing 404 connect to the base section 420 of the cover 406, for example, by sonic welding, laser welding, adhesives, and the like, to form the device 400 shown in FIGS. 19A-C. In some embodiments, the cover 406 is provided to the base housing 404 via a vacuum carrier or the like. For example, each cover 406 may be picked up through vacuum suction with a suction nozzle (not shown) and, in this state, transferred to the device 400 to a predetermined mounting position. However, embodiments herein are not thus limited, as various alternative techniques for transferring and securing the cover 406 to the base housing 404 are possible.

Figure 21:
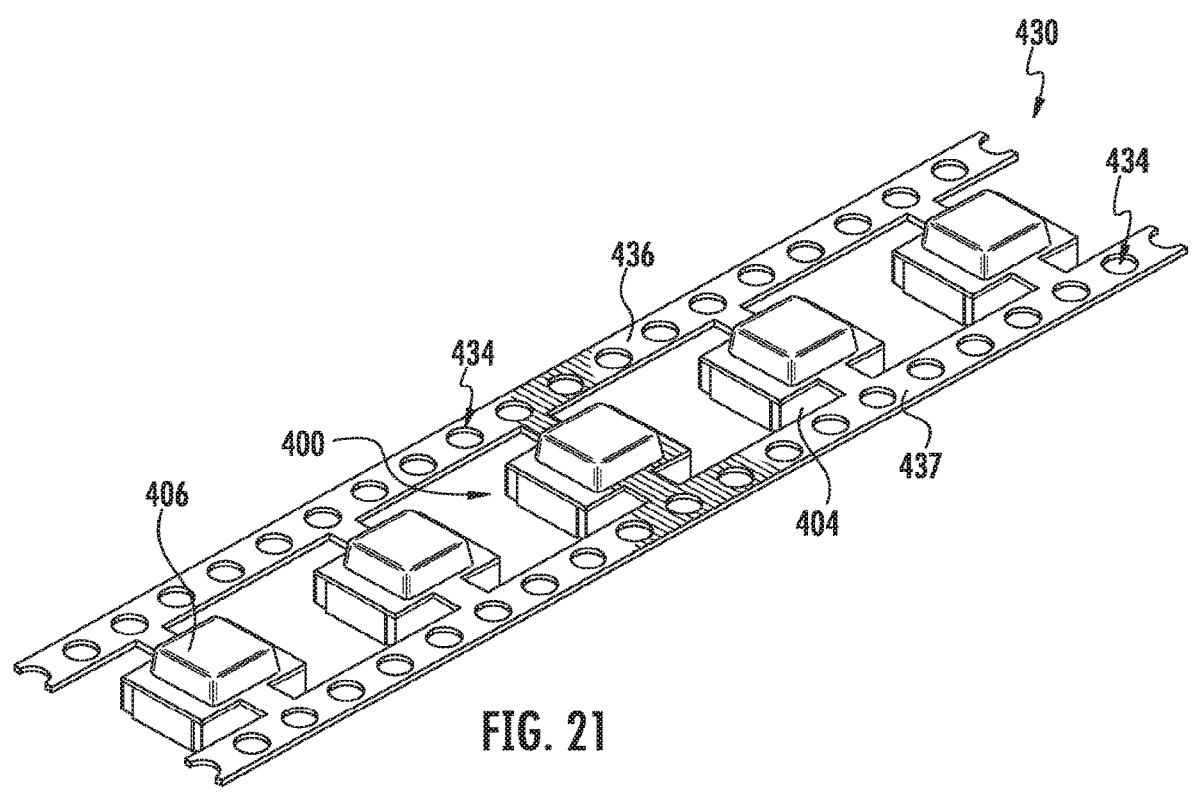
FIG. 21 depicts an approach for providing a plurality of devices in accordance with the present disclosure.

Turning now to FIG. 21, an approach for attaching a plurality of covers 406 to a plurality of base housings 404 according to embodiments of the present disclosure will be described in greater detail. As shown, a carrier tape 430 including a plurality of covers 406 may be provided atop multiple base housings 404. In exemplary embodiments, the carrier tape 430 may include a first edge 436 and a second edge 437, each including advancement holes 434. Once configured, the carrier tape 430 may be supplied to an automatic placement machine (not shown) via a carrier tape feeder for processing. In some embodiments, after the carrier tape 430 is joined to the base housings 404, each of the connectors 447 securing the base housing 204 and the cover 206 to the first and second edges 436, 437 may be cut or broken. The electronic device (such as the electronic device 400 depicted in FIGS. 19A-C) may then be extracted from the carrier tape 430, e.g., via a vacuum carrier or the like, and secured to a PCB. While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A surface mounted device comprising:
   a base housing including a pair of sidewalls each having a plurality of corner protrusions, the plurality of corner protrusions extending inwards towards a recessed center portion;
   an electronic component coupled to the base housing, the electronic component including a fusible element extending between a pair of terminals, wherein the pair of terminals are coupleable to a substrate, and wherein each terminal of the pair of terminals includes a first end directly connected with the fusible element and a second end terminating along an underside of the base housing; and
   a cover disposed over the fusible element, wherein the cover is directly coupled to a top surface of each of the plurality of corner protrusions of the base housing, wherein the pair of terminals extend along an outer surface of the base housing, and wherein the cover is positioned over the first and second ends of each terminal of the pair of terminals.

2. The surface mounted device according to claim 1, wherein the substrate is a printed circuit board.

3. The surface mounted device according to claim 2, wherein the pair of terminals are coupled to the printed circuit board.

4. The surface mounted device according to claim 3, further comprising a connective material electrically connecting the pair of terminals to the printed circuit board.

5. The surface mounted device according to claim 1, wherein the pair of terminals wrap around an exterior surface of a pair of opposing end walls of the base housing.

6. The surface mounted device according to claim 1, the base housing further comprising a set of terminal channels extending through an outer surface of the base housing, wherein the set of terminal channels are recessed below the top surface of the plurality of corner protrusions to allow each terminal of the pair of terminals to pass therethrough when the cover is coupled to the base housing, and wherein each terminal of the pair of terminals is not in direct physical contact with the cover.

7. The surface mounted device of claim 1, wherein the top surface of each corner protrusion of the plurality of corner protrusions is planar with a top surface of each sidewall of the pair of sidewalls.

* * * * *